(12) United States Patent
Wirz et al.

(10) Patent No.: US 10,276,539 B1
(45) Date of Patent: Apr. 30, 2019

(54) METHOD FOR 3D INK JET TCB INTERCONNECT CONTROL

(71) Applicant: Micron Technology, Inc., Boise, ID (US)

(72) Inventors: Brandon P. Wirz, Boise, ID (US); Benjamin L. McClain, Boise, ID (US); C. Alexander Ernst, Boise, ID (US); Jeremy E. Minnich, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/797,900

(22) Filed: Oct. 30, 2017

(51) Int. Cl.
*H01L 23/00* (2006.01)

(52) U.S. Cl.
CPC ............. *H01L 24/81* (2013.01); *H01L 24/13* (2013.01); *H01L 24/16* (2013.01); *H01L 24/73* (2013.01); *H01L 24/83* (2013.01); *H01L 24/94* (2013.01); *H01L 2224/10145* (2013.01); *H01L 2224/13147* (2013.01); *H01L 2224/13655* (2013.01); *H01L 2224/16148* (2013.01); *H01L 2224/73204* (2013.01); *H01L 2224/81007* (2013.01); *H01L 2224/81203* (2013.01); *H01L 2224/81359* (2013.01); *H01L 2224/81815* (2013.01); *H01L 2224/83203* (2013.01); *H01L 2924/014* (2013.01); *H01L 2924/3651* (2013.01); *H01L 2924/3841* (2013.01)

(58) Field of Classification Search
CPC ....... H01L 23/00; H01L 23/48; H01L 23/488; H01L 23/4952; H01L 23/49811
See application file for complete search history.

(56) References Cited

U.S. PATENT DOCUMENTS

| | | | | | |
|---|---|---|---|---|---|
| 5,411,400 | A | * | 5/1995 | Subrahmanyan | ....... H01L 24/11 257/775 |
| 7,557,452 | B1 | * | 7/2009 | Williams | .......... H01L 23/49811 257/697 |
| 2008/0007608 | A1 | * | 1/2008 | Smith | ...................... H05K 3/32 347/111 |
| 2008/0116762 | A1 | * | 5/2008 | Inoue | ..................... H03H 9/059 310/313 R |
| 2012/0313236 | A1 | * | 12/2012 | Wakiyama | ............ H01L 23/544 257/734 |

(Continued)

*Primary Examiner* — Peniel M Gumedzoe
(74) *Attorney, Agent, or Firm* — Parsons Behle & Latimer

(57) ABSTRACT

A semiconductor device, semiconductor device assembly, and method of forming a semiconductor device assembly that includes a barrier on a pillar. The semiconductor device assembly includes a semiconductor device disposed over another semiconductor device. At least one pillar extends from one semiconductor device towards a pad on the other semiconductor device. The barrier on the exterior of the pillar may be a standoff to control a bond line between the semiconductor devices. The barrier may reduce solder bridging and may prevent reliability and electromigration issues that can result from the IMC formation between the solder and copper portions of a pillar. The barrier may help align the pillar with a pad when forming a semiconductor device assembly and may reduce misalignment due to lateral movement of the semiconductor devices. Windows or slots in the barrier may permit the expansion of solder in predetermined directions while preventing bridging in other directions.

18 Claims, 3 Drawing Sheets

(56) References Cited

U.S. PATENT DOCUMENTS

| | | | |
|---|---|---|---|
| 2014/0159235 A1* | 6/2014 | Odaira | H01L 24/13 257/737 |
| 2014/0203428 A1* | 7/2014 | Colgan | H01L 24/03 257/737 |
| 2015/0115440 A1* | 4/2015 | Higuchi | H01L 24/05 257/737 |

* cited by examiner

METHOD FOR 3D INK JET TCB INTERCONNECT CONTROL

FIELD

The embodiments described herein relate to semiconductor device assemblies having interconnect structures and methods of providing such semiconductor device assemblies. The present disclosure relates to a barrier to partially surround pillar interconnects. The present disclosure also relates to the barrier providing a standoff to support a semiconductor device, such as a die, on a substrate.

BACKGROUND

Semiconductor device assemblies, including, but not limited to, memory chips, microprocessor chips, and imager chips, typically include a semiconductor device, such as a die, mounted on a substrate, the semiconductor device assembly may be encased in a plastic protective covering or metal heat spreader. The semiconductor device assembly may include various functional features, such as memory cells, processor circuits, and imager devices, and may include bond pads that are electrically connected to the functional features of the semiconductor device assembly. The semiconductor device assembly may include semiconductor devices stacked upon and electrically connected to one another by individual interconnects between adjacent devices within a package.

Various methods and/or techniques may be employed to electrically interconnect adjacent semiconductor devices and/or substrates in a semiconductor device assembly. For example, individual interconnects may be formed by reflowing tin-silver (SnAg), also known as solder, to connect a pillar to a pad. Typically, the pillar may extend down from a bottom surface of a semiconductor device towards a pad formed on the top surface of another semiconductor device or substrate. A pillar may have a base portion comprised of copper (Cu) and an end portion comprised of solder. The pillar may include a layer of nickel (Ni) positioned between the copper portion and the solder portion, which acts as a barrier to prevent undesirable intermetallic compound (IMC) formation between the copper and solder. However, in some instances solder flows out and around the nickel barrier to the copper portion of the pillar, which may lead to IMC issues.

Various methods and/or techniques may be employed to support adjacent dies and/or substrates in a semiconductor device assembly. For example, thermal compression bonding (TCB) with non-conductive film (NCF), also known as wafer level underfill (WLUF), is a technique that may be used to connect a semiconductor device to a substrate to create a semiconductor device assembly. As an example, underfill material, which may be a laminated sheet of film, is deposited onto a wafer comprising multiple dies. The wafer may be diced to form individual dies that are then bonded to a substrate. One potential disadvantage of WLUF is the presence of voids due to the topography (e.g., copper traces, solder mask) of the substrate. For example, the topography may create capture voids underneath the die area.

When forming a semiconductor device assembly it may be desired to have a specific bond line between the semiconductor device and the substrate or adjacent semiconductor device. During the bonding process, the force applied during the bonding process may need to be varied in an attempt to obtain the specified bond line. For example, when the NCF material is at a high viscosity state a higher force may need to be applied to obtain the desired bond line, but as the NCF is heated during the TCB process the viscosity of the NCF may decrease so that less force is required to obtain the desired bond line. The change in viscosity during the TCB process, which in turn causes a variation in the applied force may make it difficult to consistently obtain the desired bond line for the duration of the process.

A higher force applied during the TCB process may help to eliminate the WLUF voids, but the higher applied force may cause solder to unintentionally bridge across traces and/or interconnects of the semiconductor device assembly as would be appreciated by one of ordinary skill in the art. Alternatively, the solder thickness may be reduced to help eliminate bridging, but a reduced solder thickness may lead to metastable IMC issues as would be recognized by one of ordinary skill in the art.

Additional drawbacks and disadvantages may exist.

Figure 1:
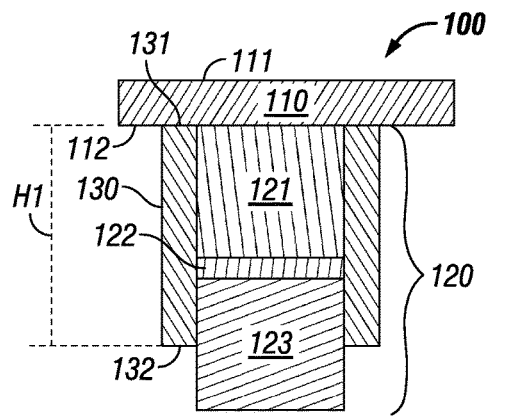
FIG. 1 is a schematic cross-section view of an embodiment of a semiconductor device with a pillar having an exterior barrier.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor die, but semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor package can also include a substrate that carries one or more semiconductor devices. The substrate may be attached to or otherwise incorporate within the housing or casing.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, semiconductor packages, and methods of making and/or operating semiconductor devices. In one embodiment of the disclosure a semiconductor device assembly comprises a first semiconductor device and a second semiconductor device disposed over the first semiconductor device, the second semiconductor device has at least one pillar that extends towards the first semiconductor device with a barrier that is positioned on at least a portion of the exterior of the at least one pillar. One end of the barrier may be castellated. In other words, the barrier may include a plurality of slots, also referred to herein as windows, in one end of the barrier.

The barrier on the exterior of the pillar may help to prevent bridging between two adjacent interconnects and/or prevent bridging with another element as the semiconductor devices are bonded together to from a semiconductor device assembly. The barrier may act as a standoff, which may help to achieve a desired bond line between two semiconductor devices when forming a semiconductor device assembly. The barrier may help to prevent electromigration of solder into a copper portion of a pillar during the TCB process to bond two semiconductor devices together. The barrier may help with the alignment of a pad on an adjacent semiconductor device and may also help to prevent misalignment with the pad due to movement of the one semiconductor device with the respect to another semiconductor device.

FIG. 1 shows a schematic of a semiconductor device 100 having a substrate 110 with a first or top surface 111 and a second or bottom surface 112. At least one pillar 120 extends from the second surface 112 of the substrate 110 of semiconductor device 100. A plurality of pillars 120 may extend from the second surface 112 of the substrate 110 of the semiconductor device 100 as would be appreciated by one of ordinary skill in the art having the benefit of this disclosure. The pillar 120 may be comprised of copper portion 121 and a solder (e.g., tin-silver) portion 123 that is separated by a nickel portion 122. The nickel portion 122 may act as a barrier that helps to prevent the undesirable IMC formation between the solder portion 123 and the copper portion 121 of the pillar 120. The semiconductor device 100 includes a barrier 130 positioned on a portion of the exterior of the pillar 120. The size, shape, and/or configuration of the substrate 110, pillar 120, components of the pillar 120, and the barrier 130 are for illustrative purposes only and may be varied as would be appreciated by one of ordinary skill in the art having the benefit of this disclosure. For example, the semiconductor device 100 may include a plurality of pillars 120 that extend from the bottom surface 112 of the substrate 110 with a barrier 130 positioned and/or formed on a portion of the exterior of each of the plurality of pillars 120.

The barrier 130 on the exterior of the pillar 120 extends a first distance, H1, away from the bottom surface 112 of the semiconductor device 100. A first end 131 of the barrier 130 may be positioned adjacent to the second surface 112 of the semiconductor device 100 with a second end 132 of the barrier 130 positioned away from the second surface 112 of the semiconductor device 100. The first distance, H1, may be the distance between the first and second ends 131, 132 of the barrier 130. Alternatively, the first distance, H1, may be the distance from the second end 132 of the barrier 130 to the bottom surface 112 of the substrate 110 if the first end 131 of the barrier 130 does not extend completely to the bottom surface 112 of the substrate 110. The second end 132 of the barrier 130 may be castellated. In other words, the barrier 130 may include a plurality of slots or windows 135 (shown in FIG. 4) that are positioned adjacent to the second end 132 of the barrier 130. The plurality of slots or windows 135 in the barrier 130 may be configured to direct molten solder 123 in a direction or directions away from adjacent pillars 120, or other features, located on the second surface 112 of the semiconductor device 100. Likewise, the plurality of slots or windows 135 in the barrier 130 may be configured to direct molten solder 123 in a direction or directions away from pads, or other features, on the top surface of an adjacent semiconductor device of a semiconductor device assembly. Directing molten solder in predetermined directions may reduce the possibility of bridging during a TCB process to form a semiconductor assembly.

The barrier 130 on a portion of the exterior of the pillar 120 may act as a standoff during a TCB process, which may help to achieve a desired bond line between two semiconductor devices when forming a semiconductor device assembly. The barrier 130 on a portion of the exterior of the pillar 120 may help to prevent undesirable IMC formation between the solder and copper portions of a pillar 120. For example, during a TCB process the barrier 130 may help to prevent molten solder from flowing out and around the nickel portion 122 of the pillar 120. The barrier 130 on a portion of the exterior of the pillar 120 may help with the alignment of the pillar 120 with a pad on the top surface of an adjacent semiconductor device. The barrier 130 on a portion of the exterior of the pillar 120 may help to prevent misalignment between a pillar 120 and a pad on a top surface of an adjacent semiconductor device due to movement of the semiconductor devices with respect to each other.

The barrier 130 may be comprised of various materials that may be used to direct molten solder in desired directions, reduce potential bridging, act as a standoff, prevent reliability and electromigration issues that can result from the IMC formation between the solder and copper portions of a pillar, aid in alignment of a pillar with a pad, and/or prevent misalignment due to movement of adjacent semiconductor devices with respect to each other. For example, the barrier 130 may be comprised of, but not limited to, polyimides, polyimide-like materials, polymers, epoxies, epoxy-acrylates, and/or a solder mask materials. The barrier 130 may be formed on the exterior of the pillar 120 by various processes as would be appreciated by one of ordinary skill in the art having the benefit of this disclosure. For example, the barrier 130 may be printed on the exterior of the pillar 120. A 3D inkjet printer may be used to print the barrier 130 onto the exterior of the pillar 120. A printed barrier 130 may provide an advantage in that the barrier 130 may have more precise dimensions on the exterior pillar 120 than other mechanisms used to provide the barrier 130, which may be beneficial if the pillar barrier 130 is to be used as a standoff during the formation of a semiconductor device assembly. In another embodiment, the barrier 130 may be spin coated onto the exterior of the pillar 120 and/or forming the barrier 130 may include a photolithography or other patterning process. Various mechanisms and/or materials may be used to form the barrier 130 on the exterior pillar 120 depending on the application as would be appreciated by one of ordinary skill in the art having the benefit of this disclosure.

Figure 2:
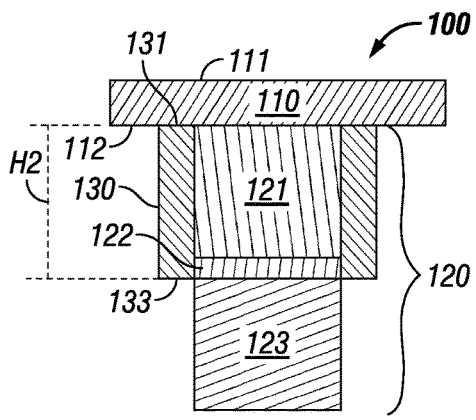
FIG. 2 is a schematic cross-section view at a different angle of the semiconductor device of FIG. 1 with a pillar having an exterior barrier.

FIG. 2 is a schematic cross-section view of the semiconductor device 100 of FIG. 1 at a different orientation from FIG. 1. For example, the barrier 130 on a portion of the exterior of the pillar 120 may be castellated including a plurality of windows or slots 135 (shown in FIG. 4) that are located in the horizontal directions between the horizontal (i.e. x) and vertical (i.e. y) directions in a horizontal plane. The barrier 130 includes a third end 133 that is a second distance, H2, from first end 131 of the barrier 130. The second distance, H2, may be the distance between the third end 133 of the barrier 130 and the bottom surface 112 of the substrate 110 if the barrier 130 does not extend completely to the bottom surface 112 of the substrate 110. The third end 133 is adjacent to a window or slot 135 in the second end 132 of the barrier 130. Thus, the second distance, H2, to the third end 133 is less than the first distance, H1, to the second end 132. The second end 133 may be positioned adjacent to the nickel portion 122 of the pillar 120. Alternatively, the second end 133 may be positioned along the solder portion 123 of the pillar 120, but at a distance, H2, from the second surface 112 of the substrate 110 that is less than the distance, H1, that the second end 132 of the barrier 130 is away from the second surface 112 of the substrate 110.

Figure 3:
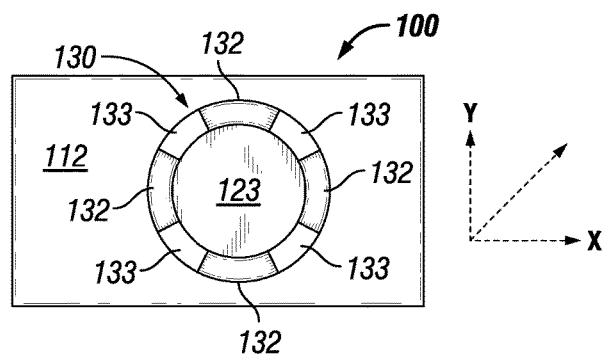
FIG. 3 is a schematic end view of the semiconductor device of FIG. 1 with a pillar having an exterior barrier.
Figure 4:
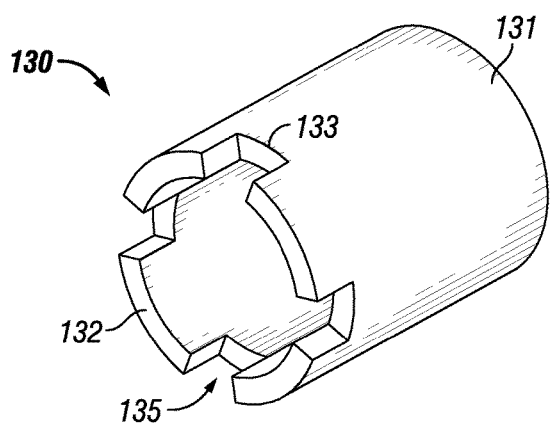
FIG. 4 is an isometric view of an embodiment of a barrier that may be positioned and/or formed on a portion of a pillar of a semiconductor device.

FIG. 3 is a schematic end view of the semiconductor device 100 of FIG. 1 and FIG. 4 is an isometric view of an embodiment of a barrier 130. The pillar 120 (best shown in FIG. 1 and FIG. 2) and the barrier 130 extend from the bottom or second surface 112 of the substrate 110 (best shown in FIG. 1 and FIG. 2) of the semiconductor device 100. The barrier 130 may be positioned and/or formed around the entire perimeter of the exterior of the pillar 120. The pillar 120 includes a plurality of slots or windows 135 (shown in FIG. 4) as illustrated by third ends 133 of the barrier 130 positioned between the second ends 132 of the barrier 130. The slots or windows 135 and thus, the third ends 133 may be positioned in diagonal directions with respect to the horizontal axis (depicted as the x axis) and the vertical axis (depicted as the y axis) along the horizontal plane of the substrate 110. The positioning of the slots or windows 135 may be configured to direct molten solder in a direction away from adjacent pillars. For example, the slots or windows 135 of the barrier 130 of FIGS. 3 and 4 would direct molten solder in the horizontal directions and not in the x axis or y axis. The shape, position, number, and/or configuration of the windows or slots 135 of the barrier 130 as shown in FIGS. 3 and 4 are for illustrative purposes only and may be varied depending on application as would be appreciated by one of ordinary skill in the art having the benefit of this disclosure. For example, the barrier 130 may only have two slots or windows spaced approximately one hundred and eighty degrees apart. Likewise, the barrier 130 may include slots or windows in the x direction and/or the y directions.

Figure 5A:
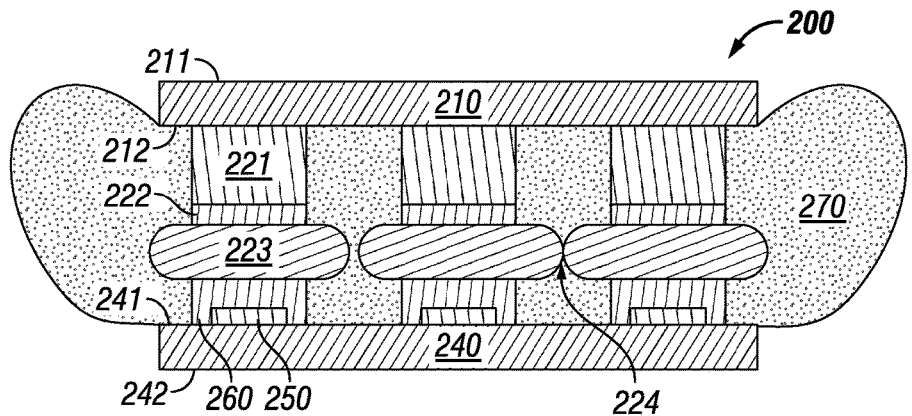
FIG. 5A is a schematic of a semiconductor device assembly with interconnects without a barrier on the pillar portion of the interconnects between the semiconductor devices of the assembly.

FIG. 5A shows a schematic cross-section view of an embodiment of a prior art semiconductor device assembly 200. The semiconductor device assembly 200 includes a first substrate or semiconductor device 240 having a top or first surface 241 and a second or bottom surface 242 and a second substrate or semiconductor device 210 having a top or first surface 211 and a bottom or second surface 212. Pillars comprised of a copper portion 221, a nickel portion 222, and a solder portion 223 extend from the second surface 212 of the second substrate or semiconductor device 210 and form interconnects with pads 260 on the top or first surface 241 of the first substrate or semiconductor device 240. The pads 260 are connected to traces 250 on the first surface 241 of the first substrate or semiconductor device 240 as would be appreciated by one of ordinary skill in the art having the benefit of this disclosure. The semiconductor device assembly 200 includes NCF material 270 between the first substrate or semiconductor device 240 and the second substrate or semiconductor device 210.

As discussed herein, the topography on the top surface 241 of the first substrate or semiconductor device 240 and the bottom surface 212 of the second substrate or semiconductor device 210 may inhibit flow of the NCF material 270 potentially resulting in voids. As the first and second substrates or semiconductor devices 240, 210 are bonded together during a TCB process, the application of more force may help to eliminate voids in the NCF material 270. However, the applied force may cause solder to unintentionally form a bridge 224 as shown in FIG. 5A and as would be appreciated by one of ordinary skill in the art.

Figure 5B:
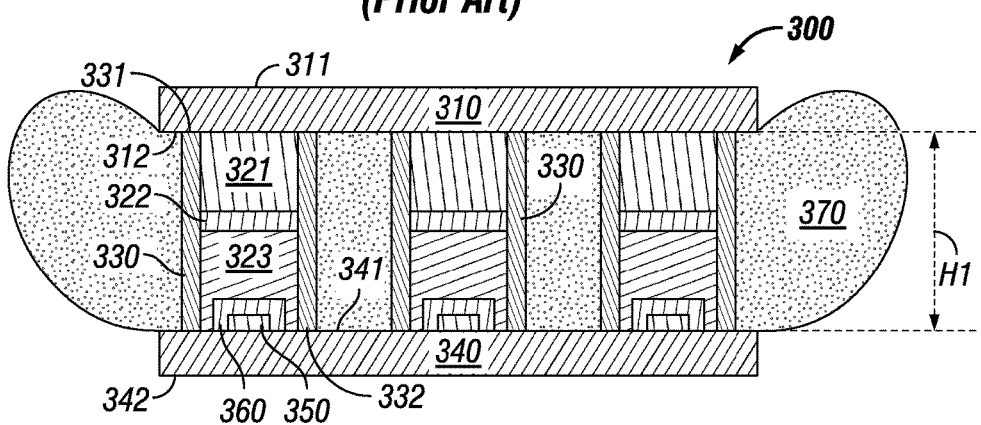
FIG. 5B is a schematic of one embodiment of a semiconductor device assembly that includes a barrier on the pillar portion of the interconnects between the semiconductor devices of the assembly.

FIG. 5B shows a schematic cross-section view of an embodiment of a semiconductor device assembly 300. The semiconductor device assembly 300 includes a first substrate or semiconductor device 340 having a top or first surface 341 and a second or bottom surface 342 and a second substrate or semiconductor device 310 having a top or first surface 311 and a bottom or second surface 312. Pillars comprised of a copper portion 321, a nickel portion 322, and a solder portion 223 extend from the second surface 312 of the second substrate or semiconductor device 310 and form interconnects with pads 360 on the top or first surface 341 of the first substrate or semiconductor device 340. The pads 360 may be connected to traces 350 on the first surface 341 of the first substrate or semiconductor device 340 as would be appreciated by one of ordinary skill in the art having the benefit of this disclosure. The semiconductor device assembly 300 includes NCF material 370 between the first substrate or semiconductor device 340 and the second substrate or semiconductor device 310.

As discussed herein, the pillars may include a barrier 330 positioned and/or formed on a portion of the exterior of the pillar. A first end 331 of the barrier 330 may be positioned adjacent to the second surface 312 of the second substrate or semiconductor device 310. The second end 332 of the barrier 330 may be used as a standoff when forming the semiconductor device assembly 300. A plurality of barriers 330 having uniform length, H1, that are positioned and/or formed on the exterior of a plurality of pillars that extend from the second surface 312 of the second substrate or semiconductor device 310 may be used to control the bond line between the first and second substrates or semiconductor devices 340, 310 when forming the semiconductor device assembly 300.

The diameter of the barriers 330 on the pillars may be larger than the area or diameter of the pads 360 located on the first surface 341 of the first substrate or semiconductor device 340. The larger diameter of the barriers 330 may help with the alignment of the pillars extending from the second surface 312 of the second substrate or semiconductor device 310 with corresponding pads 360 on the first surface 341 of the first substrate or semiconductor device 340. As discussed herein, the barriers 330 may also prevent the expansion of the solder material 323 of the pillars from expanding and bridging with adjacent pillars, traces, and/or other features on the surfaces 312, 341 of the first and second substrates or semiconductor devices 310, 340. The barriers 330 may also prevent the pads 360 from becoming misaligned with the pillars due to lateral movement of the second substrate or semiconductor device 340 with respect to the first substrate or semiconductor device 310. The barrier may be configured to retain a pad 360 within the perimeter of the barrier 330 and thus, remain in alignment with the pillar of the second substrate or semiconductor device 310. The shape, size, configuration, and/or number of the pillars (comprised of copper 321, nickel 322, and solder 323), pads 350, traces 360, and/or barriers 330 are for illustrative purposes only and may be varied depending on the application as would be appreciated by one of ordinary skill in the art having the benefit of this disclosure.

Figure 5C:
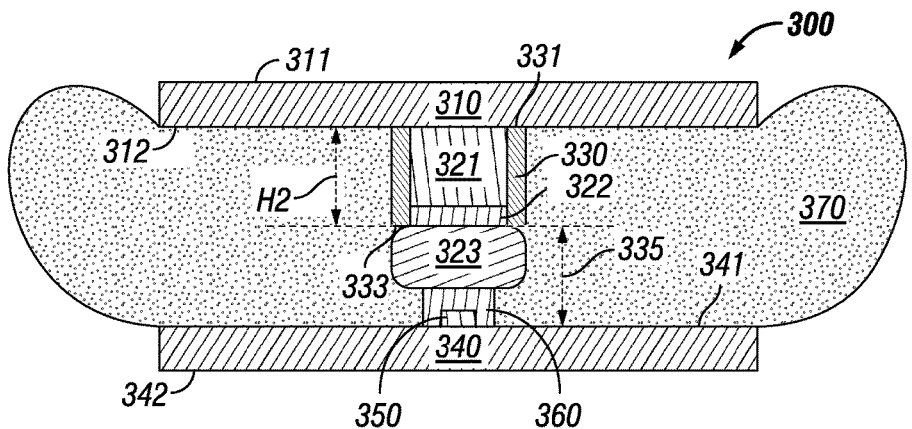
FIG. 5C is a schematic of one embodiment of a semiconductor device assembly that includes a barrier on a pillar portion of an interconnect between the semiconductor devices of the assembly.

FIG. 5C shows a schematic cross-section view of an embodiment of a semiconductor device assembly 300 at a different orientation than FIG. 5B. FIG. 5C includes a single pillar comprised of a copper portion 321, a nickel portion 322, and a solder portion 323 and a single pad 360 and trace 350 for clarity. The second substrate or semiconductor device 310 may include a plurality of pillars that extend from the second surface 312 and the first substrate or semiconductor device 340 may include a plurality of corresponding pads 360 on the first surface 341 as would be appreciated by one of ordinary skill in the art having the benefit of this disclosure.

FIG. 5C shows that the solder portion 323 of the pillar may expand through the slots or windows 335 in the barrier 330 when forming the interconnect between the pillar (comprised of copper 321, nickel 322, and solder 323) extending from the second surface 312 of the second substrate or semiconductor device 310 and the pad 360 on the first surface 341 of the first substrate or semiconductor device 340. The plurality of slots or windows 335 result in a third end 333 of the barrier 330 that has a second distance, H2, from the second surface 312 of the second substrate or semiconductor device 340 that is less than the first distance, H1, between the second end 332 of the barrier 330 and the second surface 312 of the second substrate or semiconductor device 340. As discussed herein, the location of the slot or windows 335 in the barrier 330 may be configured to direct molten solder in desired directions. For example, the barrier 330 may prevent molten solder from flowing towards areas of the semiconductor device assembly 300 that have a tighter pitch and the slot or windows 335 may permit the flow and/or expansion towards areas of the semiconductor device assembly 300 having a lower pitch. In other words, the barrier 330 may protect adjacent elements on the semiconductor device assembly 300 and permit the solder to flow and/or expand towards areas where adjacent elements are not closely located.

Figure 6:
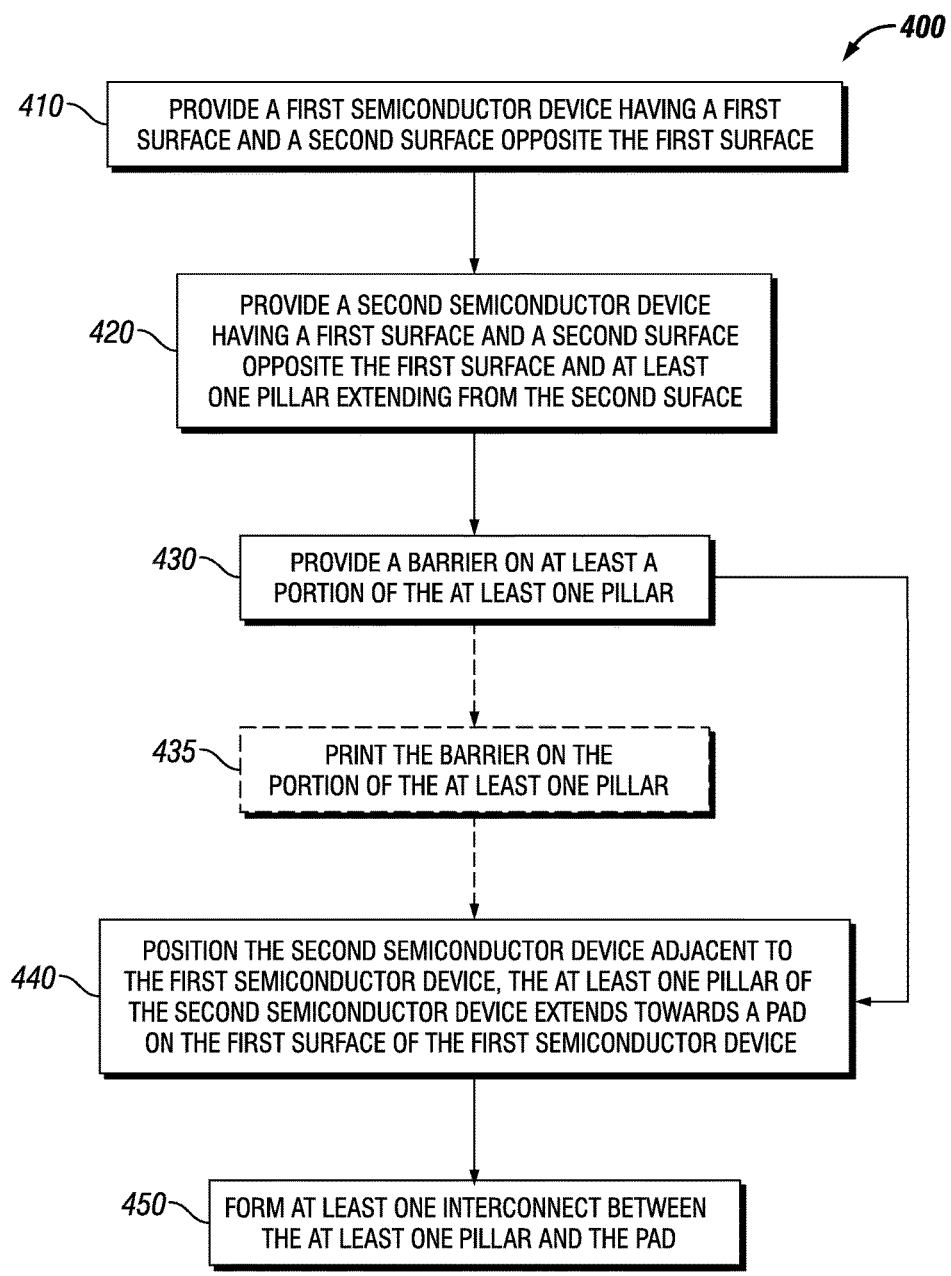
FIG. 6 is a flow chart depicting one embodiment of a method of making a semiconductor device assembly.

FIG. 6 is a flow chart for one embodiment of a method 400 of making a semiconductor device assembly. The method 400 includes providing a first semiconductor device that has a first surface and a second surface opposite the first surface, at step 410, and providing a second semiconductor device that has a first surface and a second surface opposite the first surface with at least one pillar extending from the second surface. At step 430, the method 400 includes providing a barrier on at least an exterior portion of the at least one pillar. Optionally, the barrier may be printed on the pillar, at step 435. A 3D inkjet printer may be used to print the barrier on the pillar. The method 400 includes positioning the second semiconductor device adjacent to the first semiconductor device, such that the at least one pillar of the second semiconductor device extends towards a pad on the first surface of the first semiconductor device, at step 440. At step 450, the method 400 includes forming at least one interconnect between the at least one pillar and the pad. Forming the at least one interconnect may include a thermal compression bonding step in which at least a portion of the barrier is used to set the bond line between the first and second semiconductors.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:
1. A semiconductor device assembly comprising:
  a first substrate, wherein the first substrate comprises a first semiconductor device;
  a second substrate disposed over the first substrate, wherein the second substrate comprises a second semiconductor device;
  at least one pillar that extends from the second substrate towards the first substrate, the at least one pillar comprising a copper portion positioned adjacent to the second substrate, a solder portion, and a nickel portion between the copper portion and the solder portion; and
  a barrier positioned on at least a portion of an exterior of the at least one pillar, the barrier having a first end and a second end, the second end being castellated and wherein the barrier prevents electromigration of solder from the solder portion into the copper portion of the at least one pillar.

2. The semiconductor device assembly of claim 1, wherein the at least one pillar extends towards a pad positioned over a trace on the first substrate.

3. The semiconductor device assembly of claim 1, wherein the first end of the barrier is positioned adjacent to the second substrate and the second end of the barrier is located a first distance from the second substrate and wherein a plurality of slots of the castellated second end of the barrier are located a second distance from the second substrate, the second distance being less than the first distance.

4. The semiconductor device assembly of claim 3, wherein the plurality of slots are configured to permit expansion of solder in a first plurality of directions.

5. The semiconductor device assembly of claim 4, wherein the barrier is configured to prevent expansion of solder in a second plurality of directions.

6. The semiconductor device assembly of claim 3, wherein the first distance extends from the second substrate, past the copper portion and nickel portion of the at least one pillar, and is adjacent to a portion of the solder portion of the at least one pillar, and wherein the second distance extends from the second substrate to the nickel portion of the at least one pillar.

7. The semiconductor device assembly of claim 1, wherein at least a portion of the barrier extends from a second surface of the second substrate to a first surface of the first substrate.

8. The semiconductor device assembly of claim 7, further comprising a pad on the first surface of the first substrate positioned within the portion of the barrier that extends to the first surface of the first substrate.

9. The semiconductor device assembly of claim 8, wherein the portion of the barrier that extends to the first surface of the first substrate is configured to retain the pad in alignment with the at least one pillar.

10. The semiconductor device assembly of claim 7, wherein the portion of the barrier that extends to the first surface of the first substrate supports the second substrate on the first surface of the first substrate.

11. The semiconductor device assembly of claim 1, comprising underfill material positioned between the first substrate and the second substrate, the barrier positioned between the at least one pillar and the underfill material.

12. A semiconductor device comprising:
a substrate;
a plurality of pillars extending from a surface of the substrate, each pillar having a first portion comprised of copper adjacent to the surface, a second portion comprised of nickel adjacent to the first portion, and a third portion comprised of solder adjacent to the second portion, the second portion separating the third portion from the first portion; and
a barrier on a portion of an exterior of each pillar, a first end of the barrier being adjacent to the surface of the substrate and a second end of the barrier positioned a first distance away from the surface of the substrate, the barrier prevents electromigration of solder from the third portion into the first portion of the pillar and wherein the second end of each barrier is castellated with a plurality of windows through the second end of each barrier.

13. The semiconductor device of claim 12, wherein each portion of the barrier adjacent to the windows is a second distance away from the surface, the second distance being less than the first distance.

14. The semiconductor device of claim 13, wherein the second distance extends to at least the second portion of each pillar comprised of nickel.

15. The semiconductor device of claim 14, wherein the first distance extends to at least the third portion of each pillar comprised of solder.

16. The semiconductor device of claim 13, wherein the plurality of windows for each barrier are located at horizontal directions with respect to horizontal and vertical directions, the horizontal directions located in a horizontal plane.

17. The semiconductor device of claim 13, wherein the first distance extends from the surface of the substrate to the third portion of the pillar, and wherein the second distance extends from the surface of the substrate to the second portion of the pillar.

18. The semiconductor device of claim 12, wherein the barriers are comprised of one of polyimides, polyimide-like materials, polymers, epoxies, epoxy-acrylates, and solder mask materials.

* * * * *